United States Patent
Oobuchi et al.

(10) Patent No.: US 6,764,746 B2
(45) Date of Patent: Jul. 20, 2004

(54) LOW TEMPERATURE-FIRED PORCELAIN ARTICLES AND ELECTRONIC PARTS

(75) Inventors: Takeshi Oobuchi, Nagoya (JP); Yoshiaki Naruo, Saku (JP); Yoshinori Ide, Nagano-prefecture (JP)

(73) Assignees: NGK Insulators, Ltd., Nagoya (JP); Soshin Electric Co., Ltd., Saku (JP)

( * ) Notice: Subject to any disclaimer, the term of this patent is extended or adjusted under 35 U.S.C. 154(b) by 70 days.

(21) Appl. No.: 10/091,132

(22) Filed: Mar. 5, 2002

(65) Prior Publication Data

US 2002/0193238 A1 Dec. 19, 2002

(30) Foreign Application Priority Data

Mar. 9, 2001 (JP) .................................. P2001-066030

(51) Int. Cl.[7] .......................... C03C 3/093; B32B 3/00
(52) U.S. Cl. ..................... 428/209; 428/469; 428/697; 428/702; 428/901; 501/67; 501/68; 501/79
(58) Field of Search .......................... 428/209, 689, 428/697, 699, 701, 702, 901, 469; 501/65, 66, 67, 68, 77, 79; 50/14, 24, 26

(56) References Cited

U.S. PATENT DOCUMENTS

| | | | | |
|---|---|---|---|---|
| 4,732,794 A | * | 3/1988 | Hyde | .................... 428/210 |
| 5,374,909 A | | 12/1994 | Hirai et al. | |
| 5,565,392 A | * | 10/1996 | Kinsman et al. | ............ 501/141 |
| 5,605,869 A | * | 2/1997 | Mangat et al. | ................ 501/14 |
| 5,858,893 A | * | 1/1999 | Yamamoto et al. | ........... 501/32 |
| 6,379,805 B1 | | 4/2002 | Oobuchi et al. | |

FOREIGN PATENT DOCUMENTS

| | | | | |
|---|---|---|---|---|
| EP | 1 022 264 A2 | | 7/2000 | |
| JP | 56073646 A | * | 6/1981 | ............. C03C/3/30 |
| JP | 07172916 A | * | 7/1995 | ......... C04B/35/495 |
| JP | 2000-211969 A | | 8/2000 | |
| JP | 2000211969 A | * | 8/2000 | ......... C04B/35/495 |
| JP | 2000211970 A | * | 8/2000 | ......... C04B/35/495 |

* cited by examiner

Primary Examiner—Stephen Stein
(74) Attorney, Agent, or Firm—Burr & Brown

(57) ABSTRACT

An object of the invention is to provide a low temperature fired porcelain having an optimum firing temperature not higher than 1000° C. a reduced dielectric constant ∈ r, an improved quality coefficient and a low incidence of cracks. The invention provides a low temperature-fired porcelain comprising a barium component in a calculated amount of 10 to 64 weight percent when calculated as BaO, a silicon component in a calculated amount of 20 to 80 weight percent when calculated as $SiO_2$, an aluminum component in a calculated amount of 0.1 to 20 weight percent when calculated as $Al_2O_3$, a boron component in a calculated amount of 0.3 to 1.0 weight percent when calculated as $B_2O_3$ a zinc component in a calculated amount of 0.5 to 20 weight percent when calculated as ZnO, and a bismuth component in a calculated amount of not higher than 20 weight percent when calculated as $Bi_2O_3$.

16 Claims, No Drawings ive paste is printed on each green sheet to form a
LOW TEMPERATURE-FIRED PORCELAIN ARTICLES AND ELECTRONIC PARTS

BACKGROUND OF THE INVENTION

1. Field of the Invention

The invention relates to a low temperature-fired porcelain with a low dielectric constant and a high quality coefficient Q, and to an electronic part using the porcelain.

2. Related Art Statement

A laminate type dielectric filter has been used as a high frequency circuit filter, such as a top filter, interstage filter for transmission, local filter and interstage filter for reception, in a high frequency circuit radio instrument such as a cellular phone. Examples of such laminate type dielectric filters are disclosed, for example, in JP 243810/1993A (laid-open publication).

The laminate type dielectric filter may be produced as follows. Ceramic powder for producing a dielectric material is shaped to provide a plurality of green sheets. A given conductive paste is printed on each green sheet to form a conductive paste layer with a predetermined electrode pattern on each green sheet. The obtained green sheets are then laminated to form a laminated body. The laminated body is then heated so that the green sheets and conductive paste layers are simultaneously sintered and densified to provide porcelain layers and metallic electrodes thereon.

The electrode is generally made of a metallic conductor with a low melting point, such as a silver-based conductor, copper-based conductor or nickel-based conductor. Such metallic conductor has a low melting point, for example, of not higher than 1100° C. and sometimes as low as around 930° C. It is therefore necessary to fire the laminate body at a firing temperature lower than the melting point of the metal constituting the electrode pattern.

It has been desired to provide a porcelain with a low optimum firing temperature (low temperature-fired porcelain) having a reduced dielectric constant $\in$ r and improved quality coefficient Q. Such porcelain is indispensable for reducing the stray capacity, delay time and high frequency loss of an resonator and condenser housed. The assignee filed a Japanese Patent publication JP 211,969/2000A, and disclosed a low temperature fired porcelain with a optimum firing temperature not higher than 1000° C., a dielectric constant of not higher than 10 and a quality coefficient of not higher than 2500.

SUMMARY OF THE INVENTION

In the porcelain disclosed in JP 211,969/2000A (EP 1022264A), specified amounts of zinc oxide and boron oxide that are added to a formulation for a low temperature fired porcelain of a BaO—$SiO_2$—$Al_2O_3$ system. The resulting porcelain has a low optimum firing temperature, a dielectric constant of not higher than 10 and a quality coefficient of not higher than 2500. The inventors have performed intensive research for further improving the quality coefficient while preserving the low optimum firing temperature and low dielectric constant. The inventors, however, encountered the following problems. In the above-described porcelain, a glassy raw material containing boron oxide is added to the formulation for the porcelain to supply boron oxide. It is necessary to increase the amount of boron oxide in the glassy raw material to reduce the optimum firing temperature of the porcelain. As the content of boron oxide in the glassy raw material is increased, however, the quality coefficient tends to be reduced. It is thus difficult to further improve the quality coefficient of the porcelain over 2500. On the other hand, the quality coefficient may be improved by reducing the content of boron oxide. As the content of boron oxide is reduced, however, the thermal expansion and thermal contraction behaviors of the porcelain may be changed so that the porcelain is not applicable to various kinds of electronic parts, according to the inventor's findings. Particularly when the metallic electrodes, for example made of silver, are formed between the porcelain layers as described above, cracks may occur in the porcelain layer along the interface between the porcelain layer and metallic electrode. Spaces may be also formed along the interface of the porcelain layer and metallic electrode. Such defects may result in off-specification products and thus reduce the production yield.

An object of the invention is to provide a low temperature fired porcelain having an optimum firing temperature not higher than 1000° C., a reduced dielectric constant $\in$ r, an improved quality coefficient and a low incidence of cracks.

The invention provides a low temperature-fired porcelain comprising a barium component in a calculated amount of 10 to 64 weight percent when calculated as BaO, a silicon component in a calculated amount of 20 to 80 weight percent when calculated as $SiO_2$, an aluminum component in a calculated amount of 0.1 to 20 weight percent when calculated as $Al_2O_3$, a boron component in a calculated amount of 0.3 to 1.0 weight percent when calculated as $B_2O_3$, a zinc component in a calculated amount of 0.5 to 20 weight percent when calculated as ZnO, and a bismuth component in a calculated amount of not higher than 20 weight percent when calculated as $Bi_2O_3$.

The inventors have performed an extensive research and applied a glass with a low melting point containing $B_2O_3$ as one of raw materials, for providing a porcelain with a low optimum firing temperature. As the content of $B_2O_3$ in the glass is increased, however, the quality coefficient Q of the resulting porcelain tends to be reduced as described above. It was thus difficult to obtain a porcelain with a lower optimum firing temperature and a higher quality coefficient Q at the same time. When the content of $B_2O_3$ is reduced, the quality coefficient Q may be considerably improved. However, the thermal expansion and thermal contraction behaviors may be changed so that the porcelain may not be generally adapted for use in various kinds of electronic parts. In particular, the incidence of cracks may be increased in the porcelain along the interface between the porcelain layer and metallic electrode.

The inventors have applied, based on the findings described above, $Bi_2O_3$ with $B_2O_3$ in the formulation for producing a porcelain. According to the inventors' discovery, the combination of $Bi_2O_3$ and $B_2O_3$ may be effective for improving the quality coefficient Q of a porcelain and for preventing the cracks in the porcelain at the same time. The invention is based on the discovery.

DETAILED DESCRIPTION OF THE INVENTION

In a preferred embodiment, the porcelain of the present invention is obtained using a glass containing $B_2O_3$ and a ceramics containing $B_2O_3$ as its raw materials.

In the low temperature-fired porcelain according to the invention, the content of the silicon component is preferably not lower than 20 weight percent when calculated as $SiO_2$, for reducing the dielectric constant of the porcelain to a value not higher than 10. The content of the silicon component when calculated as $SiO_2$ is preferably not lower than 30 weight percent for further reducing the dielectric constant. The content of the silicon component when calculated as $SiO_2$ is preferably not higher than 80 weight percent for reducing the optimum firing temperature of the porcelain. The content is more preferably not higher than 65 weight percent for further reducing the optimum firing temperature.

In the low temperature fired porcelain according to the invention, the content of the aluminum component is preferably not lower than 0.1 weight percent when calculated as $Al_2O_3$, for increasing the content of celsian phase with a high mechanical strength in the porcelain, so that the strength of a substrate made of the inventive porcelain (measured according to JIS R 1601) may be improved to a value not lower than 2000 $kg/cm^2$. The content of the aluminum component calculated as $Al_2O_3$ is more preferably not lower than 2.0 weight percent for further improving the strength. The content of the aluminum component calculated as $Al_2O_3$ is preferably not higher than 20 weight percent, and more preferably not higher than 15 weight percent, for reducing the optimum firing temperature of the porcelain.

In the low temperature fired porcelain according to the invention, the content of the barium component is preferably not lower than 10 weight percent, and more preferably not lower than 30 weight percent, for further improving the quality coefficient Q of the porcelain. The content of the barium component when calculated as BaO is preferably not higher than 64 weight percent for reducing the dielectric constant $\in r$ not higher than 10. The content of the barium component when calculated as BaO is more preferably not higher than 60 weight percent for further reducing the dielectric constant $\in r$.

The content of the zinc component when calculated as ZnO is preferably not lower than 0.5 weight percent (more preferably not lower than 2.0 weight percent), for reducing the thermal expansion coefficient of the porcelain and for improving the sinterability. The porcelain may thereby be sintered at a lower firing temperature. The content of the zinc component when calculated as ZnO is preferably not higher than 20 weight percent (more preferably not higher than 15 weight percent), for further improving the quality coefficient Q of the porcelain.

The content of the boron component when calculated as $B_2O_3$ is preferably not higher than 1.0 weight percent for improving the quality coefficient Q of the porcelain to a value not lower than 3500. The content of the boron component calculated as $B_2O_3$ is more preferably not higher than 0.9 weight percent for further improving the quality coefficient Q of the porcelain. The content of the boron component calculated as $B_2O_3$ is preferably not lower than 0.3 weight percent (more preferably not lower than 0.4 weight percent) for further reducing the optimum firing temperature of the porcelain.

It is possible to reduce the incidence of crack formation in the porcelain by adding the bismuth component in the formulation for producing the porcelain. This effect is most considerable in each of the following three cases:

(a) When a metallic electrode is laminated on the porcelain according to the invention;

(b) When a metallic electrode is contacted on a green sheet to be fired for the inventive porcelain and the green sheet is fired; and (c) When a metallic electrode is embedded within a green sheet for producing the inventive porcelain and the green sheet is fired.

It is necessary that the bismuth component be present in the porcelain according to the invention. The lower limit of the content of the bismuth component, however, is not particularly limited, as far as the presence of the bismuth component may be confirmed by means of any method of detection, including fluorescence X-ray analysis. The content of the bismuth component when calculated as $Bi_2O_3$ is preferably not lower than 0.1 weight percent, more preferably not lower than 0.5 weight percent, and most preferably not lower than 1.0 weight percent.

The content of the bismuth component when calculated as $Bi_2O_3$ is preferably not higher than 20 weight percent, more preferably not higher than 15 weight percent and most preferably be not higher than 10 weight percent, for further improving the quality coefficient Q.

Each of the components described above may be a metal or its compound such as oxide. The porcelain according to the invention may be substantially composed of the barium component, silicon component, aluminum component, boron component, zinc component and bismuth component. In this case, however, the porcelain may contain inevitable impurities derived from each of raw materials for supplying the above metal components. Alternatively, the porcelain according to the invention may contain one or more metal component other than the components described above. Such additional metal components include metal oxides such as MgO, CaO, $SrO_2$, $Y_2O_3$, $V_2O_5$, MnO, $Mn_2O_3$, CoO, NiO, $Nd_2O_3$, $Sm_2O_3$, $La_2O_3$, and metals such as Ag, Cu, Ni and Pd.

The material for the metal electrode used in the electronic part according to the invention is not particularly limited. Such material is preferably silver, copper, nickel, or the alloys of these metals, more preferably silver or the alloy of silver, and most preferably silver.

The low temperature-fired porcelain according to the invention may be integrated with another low temperature-fired porcelain with a dielectric constant of not lower than 10 and not higher than 150, in the electronic part according to the invention. The porcelain according to the invention may constitute a first layer, and the porcelain with a higher dielectric constant of 10 to 150 may constitute a second layer joined and laminated with the first layer.

The another low temperature-fired porcelain, forming the second layer, may preferably be of one of the following compositions:

$BaO—TiO_2—ZnO—SiO_2—B_2O_3$;

$BaO—TiO_2—Bi_2O_3—Nd_2O_3—ZnO—SiO_2—B_2O_3$;

BaO—TiO$_2$—Bi$_2$O$_3$—La$_2$O$_3$—Sm$_2$O$_3$—ZnO—SiO$_2$—B$_2$O$_3$; and

MgO—CaO—TiO$_2$—ZnO—Al$_2$O$_3$—SiO$_2$—B$_2$O$_3$.

Electronic parts or devices targeted by the invention are not particularly limited, and include laminated dielectric filters, multi-layered circuit boards, dielectric antennas, dielectric couplers and dielectric composite modules. The porcelain of the invention may also be applied to dielectric substrates.

The low temperature-fired porcelain according to the invention may preferably be produced as follows. Starting raw materials of the metal components are mixed in a given ratio to obtain mixed powder, which is then heated at a temperature between 900 to 1100° C. to obtain a calcined body. The calcined body is crushed to provide ceramic powder. The ceramic powder is shaped, preferably with glass powder composed of SiO$_2$, B$_2$O$_3$ and ZnO, to form a green sheet, which is then fired at a temperature from 850 to 930° C. to obtain the porcelain of the invention. Each of the starting materials for each metal component may be the oxide, nitrate, carbonate or sulfate of each metal element.

EXAMPLES

Production of Ceramic Powder

Powdery raw materials of barium carbonate, aluminum oxide, silicon oxide, zinc oxide and bismuth oxide were weighed in a given ratio and wet mixed to obtain a mixed powder. The mixed powder was then calcined at 900° C. to 1100° C. to obtain a calcined body, which was crushed to provide calcined powder. The calcined powder was subjected to powdery X-ray diffraction analysis to measure the crystalline phases and crystallinity. The calcined powder was then ground using a ball mill into a predetermined particle size to provide ceramic powder, which was dried.

Production of Glass Powder

Powdery raw materials of zinc oxide, boron oxide and silicon oxide were weighed and dry mixed to obtain mixed powder, which was then melted in a platinum crucible to provide a melt. The melt was dipped into water for rapid cooling to provide a massy glass. The glass was wet crushed to obtain glass powder with a low melting point.

Production of Samples for Evaluating Dielectric Properties

The thus obtained ceramic powder and glass powder were wet mixed in ion exchange water with an organic binder by using an alumina pot and alumina balls, thereby providing a slurry. The slurry was dried to obtain mixed powder, which was then shaped using a metal press into a predetermined shape to provide a shaped body. The shaped body was fired at a temperature from 900 to 930° C. to obtain a sintered body, which was then machined to a predetermined shape. The dielectric constant E r and quality coefficient Q at 3 GHz were measured.

Measurement of Substrate Strength

The sintered body was machined to provide a sample for measurement with the dimensions of 30 mm×4 mm×1 mm. Each sample was subjected to a measurement of substrate strength according to "JIS R 1601".

Tape Shaping

The ceramic powder and glass powder described above were wet mixed in an organic solvent with a plasticizer, a dispersant and an organic binder using an alumina pot and alumina balls to provide a slurry for shaping green sheets. The slurry was shaped using a doctor blade application system to provide green sheets, each sheet having a thickness of 0.03 to 2 mm.

Evaluation of Crack Formation

Condenser electrode patterns or resonator electrode patterns were screen printed on each green sheet using Ag paste. A plurality of the green sheets were then laminated to obtain a laminated body, which was cut into chips each having dimensions of 11 mm×8 mm×3 mm using a dicer. Each chip was then fired at a temperature of 850 to 930° C. for 2 hours to obtain each fired body. Each fired body was subjected to the evaluation of crack formation. The crack formation was evaluated based on an image data of ultrasonic echo reflection from the cracks by means of a ultrasonic penetrant examination system ("My Scope" manufactured by Hitachi Construction Machinery).

Experimental Results

In the above experiment, the contents of the metals were variously changed as shown in Tables 1 to 6. The above properties were measured for each test sample and are shown in Tables 1 to 6.

TABLE 1

| Test No. | Bi2O3 | BaO | SiO2 | Al2O3 | ZnO | B2O3 | Number of Samples With cracks | $\epsilon r$ | Q | Substrate Strength |
|---|---|---|---|---|---|---|---|---|---|---|
| 1 | 0.0 | 40.0 | 50.7 | 5.0 | 4.0 | 0.3 | 5/1000 | 5.9 | 2000 | 900 |
| 2 | 0.1 | 35.0 | 56.6 | 4.0 | 4.0 | 0.3 | 0/1000 | 6.0 | 3500 | 1800 |
| 3 | 0.2 | 50.0 | 38.3 | 9.0 | 2.0 | 0.3 | 0/1000 | 6.3 | 3600 | 2000 |
| 4 | 0.4 | 41.0 | 49.1 | 6.0 | 3.0 | 0.3 | 0/1000 | 7.2 | 3800 | 2400 |
| 5 | 0.5 | 45.0 | 42.0 | 5.0 | 7.0 | 0.3 | 0/1000 | 7.5 | 4300 | 2400 |
| 6 | 1.0 | 55.0 | 30.5 | 3.0 | 10.0 | 0.3 | 0/1000 | 8.3 | 4500 | 2300 |
| 7 | 4.0 | 47.0 | 39.5 | 4.0 | 5.0 | 0.3 | 0/1000 | 7.9 | 4600 | 2500 |
| 8 | 10.0 | 40.0 | 31.5 | 6.0 | 12.0 | 0.3 | 0/1000 | 7.8 | 4600 | 2400 |
| 9 | 15.0 | 34.0 | 33.5 | 2.0 | 15.0 | 0.3 | 0/1000 | 7.5 | 4100 | 2000 |
| 10 | 20.0 | 30.0 | 30.5 | 10.0 | 9.0 | 0.3 | 0/1000 | 7.6 | 3500 | 2700 |
| 11 | 25.0 | 35.0 | 35.0 | 3.0 | 2.0 | 0.3 | 0/1000 | 7.6 | 2200 | 2700 |

As can be seen from the Table 1, it is possible to reduce the crack formation in the porcelain by adding Bi$_2$O$_3$ and B$_2$O$_3$ at the same time, even when the quality coefficient Q is improved by reducing the content of B$_2$O$_3$. In particular, it is possible to obtain a considerably high quality coefficient Q, a low dielectric constant and a sufficiently large substrate strength, while preventing the crack formation, when the content of Bi$_2$O$_3$ is not higher than 20 weight percent.

TABLE 2

| Test No. | Bi2O3 | BaO | SiO2 | Al2O3 | ZnO | B2O3 | Number of Samples With cracks | εr | Q | Substrate Strength |
|---|---|---|---|---|---|---|---|---|---|---|
| 12 | 10.0 | 5.0 | 64.7 | 15.0 | 5.0 | 0.3 | 0/1000 | 5.2 | 1500 | 1800 |
| 13 | 8.0 | 10.0 | 59.6 | 12.0 | 10.0 | 0.4 | 0/1000 | 5.9 | 3600 | 3000 |
| 14 | 6.0 | 30.0 | 54.5 | 2.0 | 7.0 | 0.5 | 0/1000 | 6.2 | 4600 | 2000 |
| 15 | 4.0 | 45.0 | 36.4 | 8.0 | 6.0 | 0.6 | 0/1000 | 7.2 | 4700 | 2500 |
| 16 | 2.0 | 60.0 | 32.3 | 3.0 | 2.0 | 0.7 | 0/1000 | 8.3 | 4300 | 2100 |
| 17 | 1.0 | 64.0 | 30.2 | 2.0 | 2.0 | 0.8 | 0/1000 | 9.2 | 3700 | 2100 |
| 18 | 2.0 | 72.0 | 21.1 | 2.0 | 2.0 | 0.9 | 0/1000 | 10.1 | 3300 | 2000 |

As can be seen from Table 2, by adjusting the content of BaO to a value not lower than 10 weight percent and not higher than 64 weight percent, it is possible to obtain a porcelain with a dielectric constant of not higher than 10, a high quality coefficient of Q not lower than 3500 and a high substrate strength of not lower than 2000 kg/cm$^2$, while preventing the crack formation.

TABLE 3

| Test No. | Bi2O3 | BaO | SiO2 | Al2O3 | ZnO | B2O3 | Number of Samples With cracks | εr | Q | Substrate Strength |
|---|---|---|---|---|---|---|---|---|---|---|
| 19 | 8.0 | 62.0 | 12.5 | 5.0 | 12.0 | 0.5 | 0/1000 | 10.2 | 3500 | 2300 |
| 20 | 10.0 | 57.7 | 20.0 | 6.0 | 6.0 | 0.3 | 0/1000 | 8.9 | 4000 | 2300 |
| 21 | 3.0 | 54.3 | 30.0 | 6.0 | 6.0 | 0.7 | 0/1000 | 7.9 | 3700 | 2500 |
| 22 | 4.0 | 50.4 | 35.0 | 5.0 | 5.0 | 0.6 | 0/1000 | 7.8 | 3800 | 2400 |
| 23 | 7.0 | 20.2 | 65.0 | 4.0 | 3.0 | 0.8 | 0/1000 | 6.4 | 3500 | 2200 |
| 24 | 3.0 | 11.3 | 80.0 | 2.0 | 3.0 | 0.7 | 0/1000 | 5.2 | 3500 | 2100 |
| 25 | 2.0 | 10.0 | 83.6 | 2.0 | 2.0 | 0.4 | 0/1000 | 5.3 | 900 | 1500 |

As can be seen from Table 3, by adjusting the content of SiO$_2$ from 20 to 80 weight percent it is possible to obtain a porcelain with a dielectric constant of not higher than 10, a high quality coefficient Q of not lower than 3500 and a high substrate strength of not lower than 2000 kg/cm$^2$, while preventing the crack formation.

TABLE 4

| Test No. | Bi2O3 | BaO | SiO2 | Al2O3 | ZnO | B2O3 | Number of Samples With cracks | εr | Q | Substrate Strength |
|---|---|---|---|---|---|---|---|---|---|---|
| 26 | 5.0 | 33.0 | 55.1 | 0.05 | 6.0 | 0.8 | 0/1000 | 6.9 | 3600 | 1600 |
| 27 | 4.0 | 39.0 | 52.0 | 0.1 | 4.0 | 0.9 | 0/1000 | 7.1 | 3500 | 2000 |
| 28 | 7.0 | 50.0 | 38.7 | 2.0 | 2.0 | 0.3 | 0/1000 | 8.2 | 4200 | 2100 |
| 29 | 6.0 | 42.0 | 42.0 | 5.0 | 4.5 | 0.5 | 0/1000 | 7.5 | 4000 | 2300 |
| 30 | 2.0 | 40.0 | 35.2 | 15.0 | 7.0 | 0.8 | 0/1000 | 7.8 | 3700 | 3200 |
| 31 | 1.0 | 35.0 | 40.1 | 20.0 | 3.0 | 0.9 | 0/1000 | 7.2 | 3600 | 3300 |
| 32 | 4.0 | 30.0 | 35.0 | 25.0 | 5.3 | 0.7 | 0/1000 | 7.4 | 3800 | 3200 |

As can be seen from Table 4, by adjusting the content of Al$_2$O$_3$ from 0.1 to 20 weight percent, it is possible to obtain a porcelain with a dielectric constant of not higher than 10, a high quality coefficient Q of not lower than 3500 and a high substrate strength of not lower than 2000 kg/cm$^2$, while preventing the crack formation.

TABLE 5

| Test No. | Bi2O3 | BaO | SiO2 | Al2O3 | ZnO | B2O3 | Number of Samples With cracks | εr | Q | Substrate Strength |
|---|---|---|---|---|---|---|---|---|---|---|
| 33 | 1.0 | 40.0 | 52.0 | 6.0 | 0.2 | 0.8 | 0/1000 | 7.3 | 3700 | 2400 |
| 34 | 6.0 | 38.0 | 45.0 | 10.0 | 0.5 | 0.5 | 0/1000 | 7.2 | 4500 | 2800 |
| 35 | 7.0 | 40.0 | 39.6 | 11.0 | 2.0 | 0.4 | 0/1000 | 7.5 | 4600 | 3000 |
| 36 | 9.0 | 30.7 | 40.0 | 15.0 | 5.0 | 0.3 | 0/1000 | 7.3 | 4700 | 2300 |
| 37 | 10.0 | 37.0 | 33.7 | 4.0 | 15.0 | 0.3 | 0/1000 | 7.7 | 4500 | 2300 |
| 38 | 4.0 | 34.0 | 39.4 | 2.0 | 20.0 | 0.6 | 0/1000 | 7.3 | 3900 | 2000 |
| 39 | 3.0 | 35.0 | 33.2 | 3.0 | 25.0 | 0.8 | 0/1000 | 7.6 | 3400 | 2100 |

As can be seen from the Table 5, by adjusting the content of ZnO from 0.5 to 20 weight percent it is possible to obtain a porcelain with a dielectric constant of not higher than 10, a high quality coefficient Q of not lower than 3500 and a high substrate strength of not lower than 2000 $kg/cm^2$, while preventing the crack formation.

TABLE 6

| Test No. | Bi2O3 | BaO | SiO2 | Al2O3 | ZnO | B2O3 | Number of Samples With cracks | εr | Q | Substrate Strength |
|---|---|---|---|---|---|---|---|---|---|---|
| 40 | 4.0 | 35.9 | 40.0 | 15.0 | 5.0 | 0.1 | 2/1000 | 7.5 | 3700 | 2400 |
| 41 | 2.0 | 30.0 | 50.9 | 10.0 | 7.0 | 0.1 | 3/1000 | 6.9 | 3500 | 2300 |
| 42 | 5.0 | 34.7 | 45.0 | 11.0 | 4.0 | 0.3 | 0/1000 | 7.3 | 4600 | 3100 |
| 43 | 10.0 | 38.0 | 35.3 | 6.0 | 10.0 | 0.7 | 0/1000 | 7.7 | 4200 | 2400 |
| 44 | 1.0 | 55.0 | 35.1 | 2.0 | 6.0 | 0.9 | 0/1000 | 8.6 | 3900 | 2100 |
| 45 | 7.0 | 35.0 | 34.0 | 8.0 | 15.0 | 1.0 | 0/1000 | 7.6 | 3600 | 2800 |
| 46 | 9.0 | 40.0 | 40.4 | 7.0 | 2.0 | 1.6 | 0/1000 | 7.6 | 3100 | 2700 |

As can be seen from the Table 6, by adjusting the content of $B_2O_3$ from 0.3 to 1.0 weight percent, it is possible to obtain a porcelain with a dielectric constant of not higher than 10 and a high quality coefficient Q of not lower than 3500, while preventing the crack formation.

As described above, a low temperature fired porcelain may be provided having an optimum firing temperature not higher than 1000° C., a reduced dielectric constant ∈ r, an improved quality coefficient and a low incidence of cracks, according to the invention.

What is claimed is:

1. A low temperature-fired porcelain comprising a barium component in an amount of 10 to 64 weight percent when calculated as BaO, a silicon component in an amount of 20 to 80 weight percent when calculated as $SiO_2$, an aluminum component in an amount of 0.1 to 20 weight percent when calculated as $Al_2O_3$, a boron component in an amount of 0.3 to 1.0 weight percent when calculated as $B_2O_3$, a zinc component in an amount of 0.5 to 20 weight percent when calculated as ZnO, and a bismuth component in an amount of 0.1 to 20 weight percent when calculated as $Bi_2O_3$.

2. The porcelain of claim 1, comprising said barium component in an amount of not higher than 60 weight percent when calculated as BaO.

3. The porcelain of claim 1, comprising said silicon component in an amount of 30 to 65 weight percent when calculated as $SiO_2$.

4. The porcelain of claim 1, comprising said aluminum component in an amount of 2.0 to 15 weight percent when calculated as $Al_2O_3$.

5. The porcelain of claim 1, comprising said boron component in an amount of 0.4 to 0.9 weight percent when calculated as $B_{2O3}$.

6. The porcelain of claim 1, being substantially composed of said barium component, said silicon component, said aluminum component, said boron component, said zinc component and said bismuth component.

7. The porcelain of claim 1, having a dielectric constant ∈ r of not higher than 10.

8. The porcelain of claim 1, having a quality coefficient Q of not lower than 3500.

9. The porcelain of claim 1, having a strength of not lower than 2000 $kg/cm^2$.

10. The porcelain of claim 1, wherein said porcelain is produced from raw materials comprising a glass material containing $B_2O_3$, and a ceramic material containing $Bi_2O_3$.

11. The porcelain of claim 10, wherein said glass contains $SiO_2$, $B_2O_3$, and ZnO.

12. An electronic part comprising said low temperature-fired porcelain of claim 1.

13. The electronic part of claim 12, further comprising an electrode made of a metal.

14. The electronic part of claim 12, wherein said metal is selected from the group consisting of silver, copper, nickel, an alloy containing silver, an alloy containing copper, and an alloy containing nickel.

15. The electronic part of claim 12, comprising a first layer made of said low temperature-fired porcelain and a second layer joined with said first layer, said second layer being made of a low temperature-fired porcelain having a dielectric constant ∈ r in a range of 10 to 150.

16. The electronic part of claim 12, wherein said electronic part is selected from the group consisting of a laminated dielectric filter, a multi-layered circuit board, a dielectric antenna, a dielectric coupler and a dielectric composite module.

* * * * *

UNITED STATES PATENT AND TRADEMARK OFFICE
CERTIFICATE OF CORRECTION

PATENT NO. : 6,764,746 B2
DATED : July 20, 2004
INVENTOR(S) : Takeshi Oobuchi, Yoshiaki Naruo and Yoshinori Ide It is certified that error appears in the above-identified patent and that said Letters Patent is hereby corrected as shown below:

Column 10,
Line 20, change "$B_{2O3}$" to -- $B_2O_3$ --

Signed and Sealed this

Fourteenth Day of September, 2004

JON W. DUDAS
*Director of the United States Patent and Trademark Office*